(12) United States Patent
Nagayasu et al.

(10) Patent No.: US 7,353,076 B2
(45) Date of Patent: Apr. 1, 2008

(54) VACUUM PROCESSING METHOD AND VACUUM PROCESSING APPARATUS

(75) Inventors: Nobuo Nagayasu, Kudamatsu (JP);
Hideki Kihara, Kudamatsu (JP);
Michinori Kawaguchi, Shunan (JP);
Yuuzou Oohirabaru, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 19 days.

(21) Appl. No.: 11/362,012

(22) Filed: Feb. 27, 2006

(65) Prior Publication Data

US 2007/0100488 A1    May 3, 2007

(30) Foreign Application Priority Data

Oct. 28, 2005    (JP) ............................ 2005-313696

(51) Int. Cl.
*G06F 19/00* (2006.01)
(52) U.S. Cl. .................. 700/112; 700/114; 700/121; 700/245; 414/217; 901/2
(58) Field of Classification Search ................ 700/112, 700/114, 121, 246, 245; 156/345.32; 414/217; 901/2
See application file for complete search history.

(56) References Cited

U.S. PATENT DOCUMENTS 5,435,683 A * 7/1995 Oosawa et al. ............. 414/217

2004/0074603 A1 * 4/2004 Tamura .................. 156/345.32
2006/0100740 A1 * 5/2006 Sakiya et al. ............... 700/246

FOREIGN PATENT DOCUMENTS

JP    2001-210698    8/2001

* cited by examiner

*Primary Examiner*—Kidest Bahta
*Assistant Examiner*—Sheela Rao
(74) *Attorney, Agent, or Firm*—Antonelli, Terry, Stout & Kraus, LLP.

(57) ABSTRACT

The invention provides a semiconductor processing apparatus having a high throughput capable of appropriately coping with the positional displacement that may occur during transfer of the wafer after correcting the position thereof, without slowing down the transfer speed of the wafer. A position correction quantity of the wafer with respect to a vacuum robot is computed based on the outputs of a θ axis sensor for detecting the interception angle of the wafer during rotation of the vacuum robot and an R axis sensor for detecting the interception distance of the wafer during expansion and contraction of the vacuum robot. If the position correction quantity exceeds a predetermined standard value, an operation to change the position data is performed, and if the distance data obtained based on the outputs from the θ axis sensor and the R axis sensor exceeds a predetermined permissible value, it is determined that a displacement error has occurred and the operation is stopped.

10 Claims, 6 Drawing Sheets

OVERALL STRUCTURE

FIG.1

OVERALL STRUCTURE

FIG.2

SENSOR MOUNTING POSITIONS

FIG.3

DURING TEACHING

DETECTION METHOD OF θ AXIS SENSOR

FIG.4

DURING TEACHING

DETECTION METHOD OF R AXIS SENSOR

FIG.5
DURING NORMAL OPERATION

DETECTION METHOD OF R AXIS SENSOR
(DURING DISPLACEMENT)

FIG.6

TRANSFER OPERATION FLOW

FIG.7

VACUUM PROCESSING METHOD AND VACUUM PROCESSING APPARATUS

The present application is based on and claims priority of Japanese patent application No. 2005-313696 filed on Oct. 28, 2005, the entire contents of which are hereby incorporated by reference.

BACKGROUND OF THE INVENTION

1. Field of the Invention

The present invention relates to an art of transferring a semiconductor processing substrate (hereinafter referred to as a wafer) among the processing chambers and the like of a semiconductor processing apparatus, and more specifically, relates to a method and apparatus for correcting the position of the wafer.

2. Description of the Related Art

In semiconductor device fabrication, it is preferable to connect the processing chambers or the like and have the wafer transferred among the connected processing chambers. Such transfer of the wafer is performed via a vacuum transfer apparatus for transferring the wafer from one inner chamber to another via connecting passages communicating the processing chambers and the buffer chamber which is a vacuum transfer chamber through the inner portions of the side walls of vacuum vessels constituting the vacuum vessel or the vacuum transfer vessel. Generally, the vacuum transfer apparatus is used in cooperation with various wafer processing modules such as a semiconductor etching or ashing system, a material deposition system and a flat panel display fabricating system.

Along with the increasing demands for cleanliness and higher processing accuracy, vacuum transfer apparatuses are being adopted so that a vacuum condition is continued throughout the processes and also between processes. The vacuum transfer apparatus is disposed for example between ports or vessels for receiving wafers and a plurality of processing chambers in which the wafers are actually subjected to processes such as surface etching or film deposition. Through use of a robot arm disposed within the vacuum transfer apparatus, the wafers are transferred and handed over among the vessels and the processing chambers.

On the other hand, some problems have occurred in transferring wafers using such robots. For example, during transfer of a wafer from one chambers such as a load lock chamber to a target location such as another processing chamber, the wafer may not be positioned or aligned appropriately on the desired position at the target location.

Japanese Patent Application Laid-Open Publication No. 2001-210698 (patent document 1) discloses a method of correcting the position of a wafer by providing sensors in the R axis direction (the axis of transfer) to provide a system to correct the position of a wafer when the center of the wafer is not appropriately positioned or aligned.

However, according to the wafer alignment correcting system of the above-mentioned prior art, the methods utilizing sensors disposed in the R axis direction to detect the wafer position or utilizing sensors disposed in the θ axis direction to correct the wafer position had the following drawbacks.

(1) Since the wafer displacement is detected by the sensors and the position of the wafer is corrected before transferring the wafer into the processing chamber, the displacement occurring after the correction of position during the transfer of the wafer cannot be corrected, and the displacement cannot be detected.

(2) If the transfer speed of the wafer is slowed down before the sensor and the speed is maintained slow enough to prevent displacement of the wafer until the wafer reaches the target position, the throughput of the apparatus is deteriorated and the productivity is thereby affected.

SUMMARY OF THE INVENTION

The object of the present invention is to provide a vacuum processing apparatus or vacuum processing method having high throughput and capable of coping appropriately with the displacement of the wafer caused during hand over and transfer.

In order to achieve the above object, the method for correcting wafer position according to the present invention characterizes in calculating a position correction quantity in the rotational direction and a position correction quantity in the advancing direction of a wafer with respect to the vacuum robot based on outputs from a θ axis sensor for detecting an interception angle of the wafer during rotation of the vacuum robot and an R axis sensor for detecting an interception distance of the wafer during expansion and contraction of the vacuum robot, and performing a change operation of a position data if the position correction quantity exceeds a predetermined standard value, and if the difference in distance data acquired based on the outputs of the θ axis sensor and the R axis sensor exceeds a permissible value, it is determined that a displacement error has occurred and the operation is stopped.

According to the present invention, the position correction quantity in the rotational direction and the position correction quantity in the advancing direction of the wafer with respect to the vacuum robot is calculated based on the outputs of the θ axis sensor and the R axis sensor, and if the quantities exceed a predetermined standard value, a position data change operation is performed to appropriately align the wafer coping with the displacement during transfer operation, and if the difference in distance data acquired based on the outputs of the θ axis sensor and the R axis sensor exceeds a permissible value, it is determined that a displacement error has occurred and the operation is stopped, according to which the invention can even cope with any unanticipated displacement of the wafer.

DETAILED DESCRIPTION OF THE PREFERRED EMBODIMENTS

Now, the preferred embodiments of the present invention will be described in detail with reference to the drawings.

Embodiment 1

Figure 1:
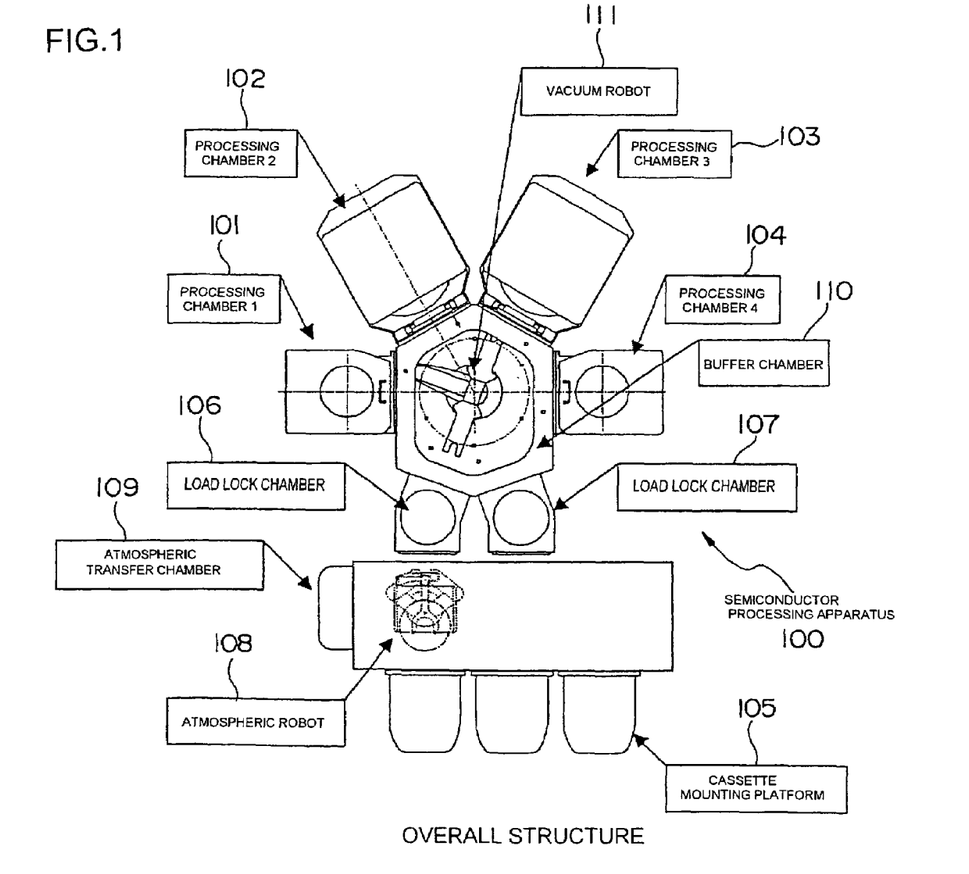
FIG. 1 is a view showing the overall structure of a semiconductor processing apparatus according to embodiment 1 of the present invention.

FIG. 1 is a view showing the whole structure of a semiconductor processing apparatus 100 according to embodiment 1 of the present invention.

The semiconductor processing apparatus 100 is capable of transferring wafers among a plurality of (four) processing chambers 101, 102, 103 and 104 and a plurality of (three) cassette mounting platforms 105.

The processing chambers 101, 102, 103 and 104 can be processing chambers for performing plasma etching, layer deposition and/or sputtering. The processing chambers 101, 102, 103 and 104 are each composed of a vacuum processing vessel having a sample stage for mounting a sample such as a wafer in the interior of the vessel decompressed to predetermined pressure (vacuum pressure), and by feeding processing gas into the interior of the vessel and applying an electric field or a magnetic field through an electric field or magnetic field apply means not shown, plasma is generated in the space above the wafer in the processing chamber, by which the vacuum vessel is utilized as a processing vessel for processing the surface of the sample.

A buffer chamber 110 of the semiconductor processing apparatus 100 being a vacuum processing apparatus is composed of a vacuum vessel capable of having its interior pressure controlled to the pressure equivalent to the interior of the processing chamber 101 or the like, and having multiple load lock chambers 106 and 107 provided to introduce wafers to the vacuum environment. Here, the processing chambers 101, 102, 103 and 104, the buffer chamber 110 and the load lock chambers 106 and 107 constitute a vacuum block in which samples are transferred and processed in decompressed condition. The plurality of load lock chambers 106 and 107 are connected to an atmospheric transfer chamber 109 having an atmospheric robot 108 disposed in the interior thereof, wherein the atmospheric transfer chamber 109 has cassette mounting platforms 105 on the front side thereof for mounting cassettes containing wafers on the upper surface thereof. The load lock chambers 106 and 107 have open/close mechanisms for taking in/out the wafers and transferring the wavers between the atmospheric transfer chamber 109 to which the cassettes are connected and the vacuum block, and also function as a transforming interface.

The atmospheric robot 108 takes out wafers from the cassettes mounted on the cassette mounting platforms 105, transfers the same into the atmospheric transfer chamber 109, and after the wafers are subjected to centering and notch alignment in the atmospheric transfer chamber 109, transfers the same into the load lock chamber 106 or 107 again.

The wafer having been transferred into the load lock chamber 106 or 107 is placed on a sample stage disposed inside the chamber. After the interior of the chamber is vacuumed, a hand disposed at an end of an arm of a vacuum robot 111 is moved below the wafer being pushed up by multiple pin-shaped wafer pushers disposed on the sample stage, and the wafer is handed over to the hand. After the wafer is handed over, the arm of the vacuum robot 111 is retracted so that the wafer on the hand is taken into the buffer chamber 110.

In the buffer chamber 110, the vacuum robot 111 rotates to face the processing chamber 101, 102, 103 or 104, and the arm of the vacuum robot 111 is expanded to transfer the wafer into the processing chamber 101, 102, 103 or 104, in which the wafer is subjected to processes such as plasma etching, layer deposition and/or sputtering.

These processes are performed in a sealed processing chamber.

The wafer being transferred into the processing chamber 101 is placed on a sample stage not shown. In this embodiment, the sample stage is equipped with multiple pusher pins disposed inside the sample stage and capable of moving up and down so as to move the wafer up and down.

With the pusher pins moved upward, the wafer placed on the hand at the end of the arm of the vacuum robot 111 placed above the pusher pins is moved down along with the lowering of the arm and mounted on the pusher pins, and the arm is moved back into the buffer chamber 110 so that the wafer is handed over to the sample stage. After the arm is moved, the pusher pin is moved downward and stored in the sample stage, according to which the wafer is mounted on a wafer mounting surface at the upper surface of the sample stage covered with dielectric film.

Thereafter, processing gas is introduced to the processing chamber 101, and the interior of the processing chamber 101 is evacuated by the operation of a vacuum pump not shown and controlled to predetermined pressure (vacuum pressure). Further, the wafer is attracted and fixed to the wafer mounting surface on the sample stage via the electrostatic chuck created between the wafer and the dielectric film by applying power to an electrostatic chucking electrode disposed in the dielectric film.

Further, heat conducting gas such as He is introduced to the space between the surface of the wafer mounting surface and the rear surface of the wafer, so as to adjust the thermal transmission between the wafer and the sample stage and control the wafer surface temperature within a desirable range. In this state, an electric field or magnetic field is applied to a space above the wafer within the processing chamber 101 to generate plasma by the processing gas, and the plasma is used to process the wafer surface.

After the process is completed, the power applied to the electrostatic chucking electrode is eliminated to reduce the electrostatic chucking force, and the pusher pins are elevated to raise the wafer upward from the wafer mounting surface. After releasing the gate valve sealing the processing chamber 101, the arm of the vacuum robot 111 is expanded so that the hand on the leading end of the arm is positioned under the wafer. By moving the pusher pins downward, the wafer is mounted on the supporting surface of the hand and handed over to the arm.

Thereafter, the pusher pins are stored again in the interior of the sample stage.

In the manner described above, the processed wafers are handed over to the vacuum robot 111 after being subjected to processes in the processing chambers 101, 102, 103 and 104, and through a combination of the contraction movement of the arm of the vacuum robot 111, the rotation of the vacuum robot 111 and the expansion movement of the arm of the vacuum robot 111, the wafers are transferred among processing chambers or between the processing chambers and the load lock chambers.

The operations of the vacuum robot 111 and the atmospheric robot 108 are controlled via control units not shown. The control unit can either be connected with the control unit for controlling the operation of the whole vacuum processing apparatus 100 or be integrated therewith.

When the wafer is handed over or transferred by the vacuum robot 111, the wafer mounted on the arm of the vacuum robot 111 may be displaced from the predetermined position even with the movement of the vacuum robot 111 controlled, and thereby, the wafer may not be accurately aligned on the target position at the transfer destination.

In other words, during hand over of the wafer, the wafer may be displaced from the predetermined position on the arm or the hand at the end thereof, or the wafer may move its position on the arm or the hand while being transferred. For example, even if the wafer is pushed up by pusher pins and the arm of the vacuum robot 111 having its movement controlled to position its hand at the end of the arm to the predetermined position under the wafer, the displacement of the wafer still occurs if the position of the wafer being pushed up by the pusher pins is displaced from the reference position for mounting the wafer on the arm or hand. This is caused for example if a certain amount of static chucking force remains when the wafer is pushed up, or by the uneven arrangement, shape or position of the pusher pins. Also, if the wafer is displaced from a reference mounting position on the wafer mounting surface when mounted thereon, displacement from the reference position during hand over is caused.

If such displacement of the wafer position occurs, the alignment of the wafer on the wafer mounting surface at target positions such as the sample stage in the processing chamber becomes unstable, which causes uneven chucking force on the wafer surface for holding the wafer or uneven processing, deteriorating the yield of the process. Other problems include accidents and contaminations caused by the wafer not being mounted stably on the arm or hand falling during hand over or coming into contact with the inner surface of the apparatus. Therefore, the wafers are desired to be mounted or handed over accurately to the predetermined position on the mounting surface of the sample stage or the upper surface of the arm or hand.

Furthermore, the wafer may be displaced from its position on the upper surface of the arm by the movement of the vacuum robot 111 during water transfer. The occurrence of this problem may be suppressed by arranging pins to correspond to the outer shape and diameter of the wafer and fixing the wafer to position by supporting the outer rim portion thereof. In this case, however, the arm position must be controlled very accurately to contact and hold supporting the outer rim of the wafer via plural pins, and accidents caused by the inappropriately supported wafer falling or tilting during transfer and unable to be positioned accurately on the target location are increased, by which the process efficiency is deteriorated even further. Moreover, the cost of the vacuum robot 111 is increased, and therefore the manufacture cost of the whole apparatus is increased. Furthermore, the dusts caused by the pins being in contact with the outer rim of the wafer contaminate the wafer and the processing chamber, deteriorating the process yield and also deteriorating the process efficiency due to increased cleaning frequency.

Therefore, the present invention supports the rear surface of the wafer via a surface or a plurality of points on the hand at the end of the arm and with a space formed around the outer rim of the wafer.

According to the arrangement of the present embodiment, the position of the wafer during wafer transfer may be moved when the vacuum robot 111 stops and moves. Therefore, it becomes necessary to detect the positional movement (displacement) of the wafer and to control the transfer and processing operations of the vacuum processing apparatus corresponding thereto.

Figure 2:
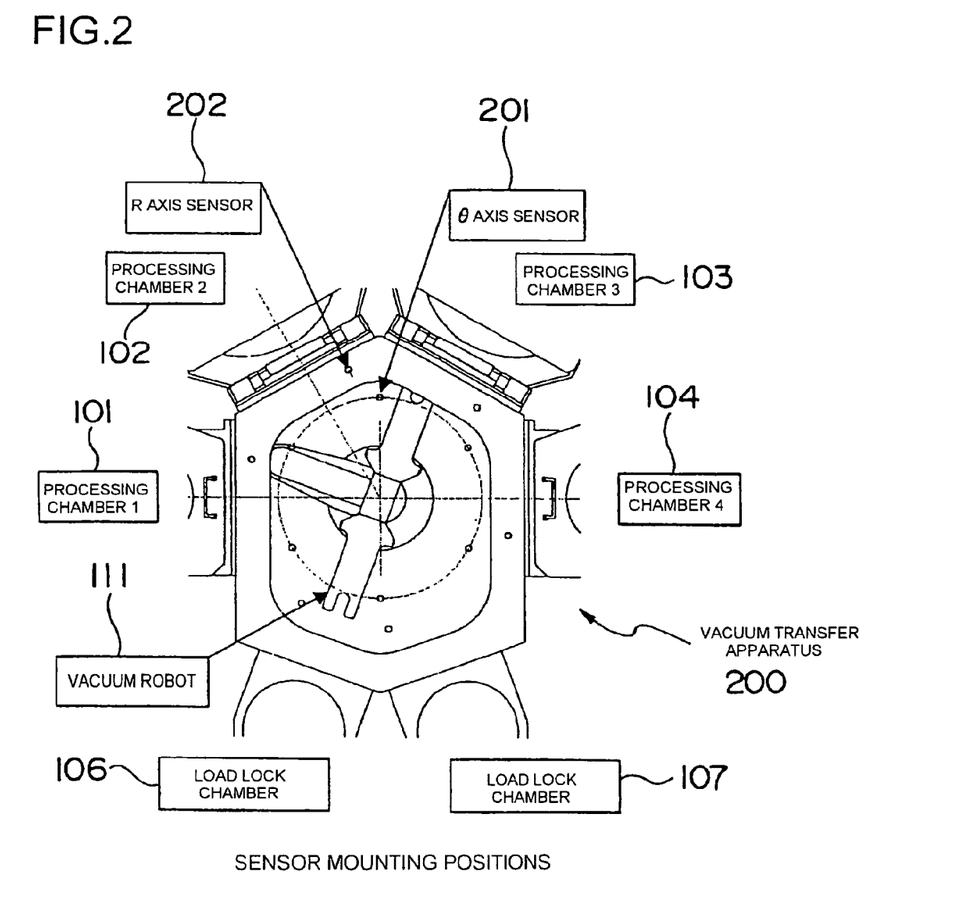
FIG. 2 is a view showing the sensor mounting position within a vacuum transfer apparatus or buffer chamber of the semiconductor processing apparatus.

FIG. 2 shows the sensor mounting positions within a vacuum transfer apparatus 200 (buffer chamber 110) of the semiconductor processing apparatus 100.

The vacuum transfer apparatus 200 has multiple processing chambers 101, 102, 103 and 104 and multiple load lock chambers 106 and 107 connected to the side walls of the vacuum vessel constituting the apparatus, and wafers can be transferred among the processing chambers and load lock chambers via passages communicating the interior of the chambers.

According to the present embodiment, the vacuum robot 111 has its center 203 positioned near the center of the buffer chamber 110, and is capable of rotating for a predetermined angle θ around the center 203 as the axis. The rotary movement of the vacuum robot 111 or its arm around the center 203 as the center axis is called a θ axis movement or θ axis rotation.

Moreover, the vacuum robot 111 is capable of extending and contracting its arm in the direction connecting the center 203 and the outer circumference (processing chamber) side of the buffer chamber 110 at a predetermined rotational angle position of the θ axis rotation so as to move the position of the hand for mounting the wafer at the end of the arm back and forth between the buffer chamber 110 and the processing chamber. This expansion and contraction movement is called an R axis (direction) movement.

According to the present invention, θ axis sensors 201 and R axis sensors 202 are provided to correspond respectively to the θ axes and the R axes of the movement of the vacuum robot 111 within the vacuum transfer apparatus 200 (buffer chamber 110) of the semiconductor processing apparatus 100. In the exemplified arrangement having two load lock chambers and four processing chambers, there are six θ axis sensors and six R axis sensors.

There are multiple numbers of θ axis sensors, at least corresponding to the numbers of processing chambers and load lock chambers, on a circumference centered around the center 203 of the vacuum robot 111, and according to the present embodiment, each sensor is composed of a pair of highly directional optical sensors disposed on the upper and lower portions of the buffer chamber 110 for sensing the amount of light generated from one of the upper and lower sensors toward the other sensor, so that the existence of the wafer or the passing of the wafer between the upper and lower mounting positions of sensors can be detected by the light being intercepted by the wafer. By providing such pairs of sensors at radial positions through which the wafer passes during rotational movement of the vacuum robot 111, it becomes possible to compute the distance from the center of the vacuum robot to the center of the wafer using the output of the θ axis sensors 201 during rotation of the vacuum robot 111.

Further, the R axis sensors 202 are disposed along the direction of expansion and contraction of the arm of the vacuum robot 111, in other words, along the line connecting each processing chamber or load lock chamber and the center 203. In the present embodiment, the R axis sensors are highly directional optical sensors similar to the θ axis sensors 201, wherein the existence of the wafer or the passing of the wafer at the mounting positions of sensors is detected during expansion and contraction movement of the arm on which the wafer is mounted. The distance between the center of the hand of the vacuum robot 111 and the center of the wafer can be computed using the output of the R axis sensors during expansion and contraction of the arm. The θ axis sensors 201 and the R axis sensors 202 are arranged at positions in which the existence of wafers are not detected between the pairs of sensors when the wafers are located at their retracted position in the processing chamber or at a standby position. In other words, the θ axis sensors 201 and the R axis sensors 202 are for detecting the passing of wafers and the time thereof, and not for detecting the existence of wafers.

The amount of displacement based on the output of θ axis sensors 201 and R axis sensors 202 is computed, and only when the amount of displacement exceeds a predetermined standard value, a correction of position is performed. The amount of displacement is computed by setting the value at the time of teaching as the absolute value and calculating the difference therefrom to obtain the amount of displacement.

Teaching is performed both for the atmospheric robot 108 and for the vacuum robot 111. In the vacuum robot 111, the rotational angles of the vacuum robot 111 from the original point of movement to each of the processing chambers and the distances from the retract position prior to hand over to each of the processing chambers are set. In other words, the positions being the reference of movement of the arm or hand is stored and set in the vacuum robot 111 or the control unit capable of adjusting the position of the arm or hand within the movable range as relative positional information with respect to either the specific position of the wafer placed on the arm or hand or the specific target positions within the apparatus such as the sample stage in the processing chamber 101.

For example, the position of the arm at which the specific position of the wafer mounted on a specific position on the hand of the arm and the specific position above the sample stage of the processing chamber 101 are arranged at a predetermined distance is set as the reference positional information. Based on the reference positional information, the position of the arm controlled by the θ axis rotation of the vacuum robot 111 or the expansion and contraction of the arm in the R axis direction is adjusted. These adjustments are performed using a jig so that the center of the hand corresponds to the center of the processing chambers.

Figure 3:
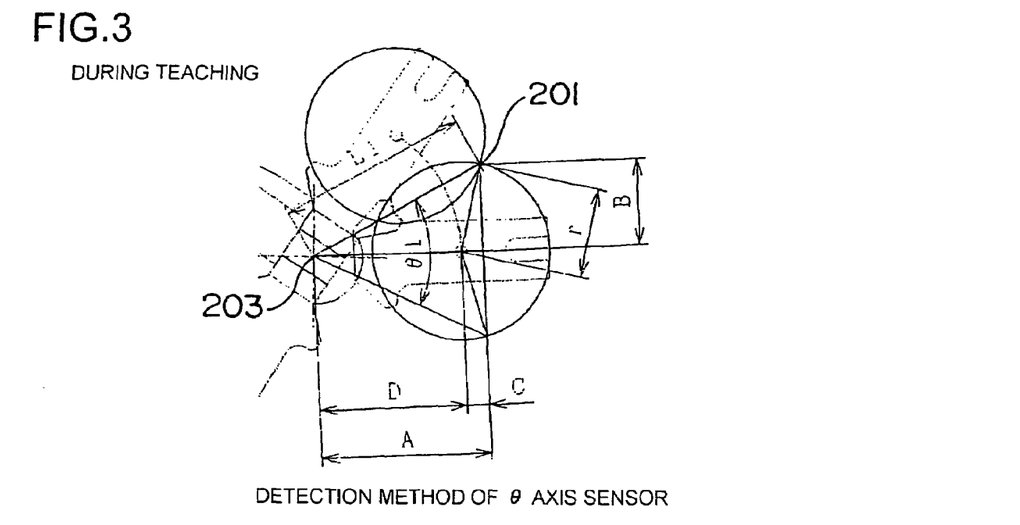
FIG. 3 is a view showing the detection method of the θ axis sensor.

FIG. 3 illustrates in patterns how the positional information of the vacuum robot 111 or wafer is detected using the θ axis sensor 201 during the teaching process.

By detecting the on/off of the θ sensor 201, an interception angle θ1 can be computed by $$\theta 1 = \theta on - \theta off \text{ (deg)} \quad (1).$$

Based on the computed θ1, the distance A is computed by $$A = \cos(\theta 1/2) \times L1 \text{ (mm)} \quad (2).$$

Further, based on the mounting distance L1 of the θ axis sensor 201 and the computed distance A, the distance B is computed by $$B = \sqrt{(L1^2 - A^2)} \text{ (mm)} \quad (3).$$

Moreover, based on the wafer radius r and the computed distance B, the distance C is computed by $$C = \sqrt{(r^2 - B^2)} \text{ (mm)} \quad (4).$$

The distance L1 from the center 203 to the θ axis sensor 201 that does not easily vary according to the movement of the apparatus is used for the above detection. According to this arrangement, the detection accuracy of positions during teaching or during processing operations of the apparatus can be improved.

Based on the above arrangement, the distance D from the center 203 of the vacuum robot to the center of the wafer can be computed by $$D = A - C \text{ (mm)} \quad (5).$$

Figure 4:
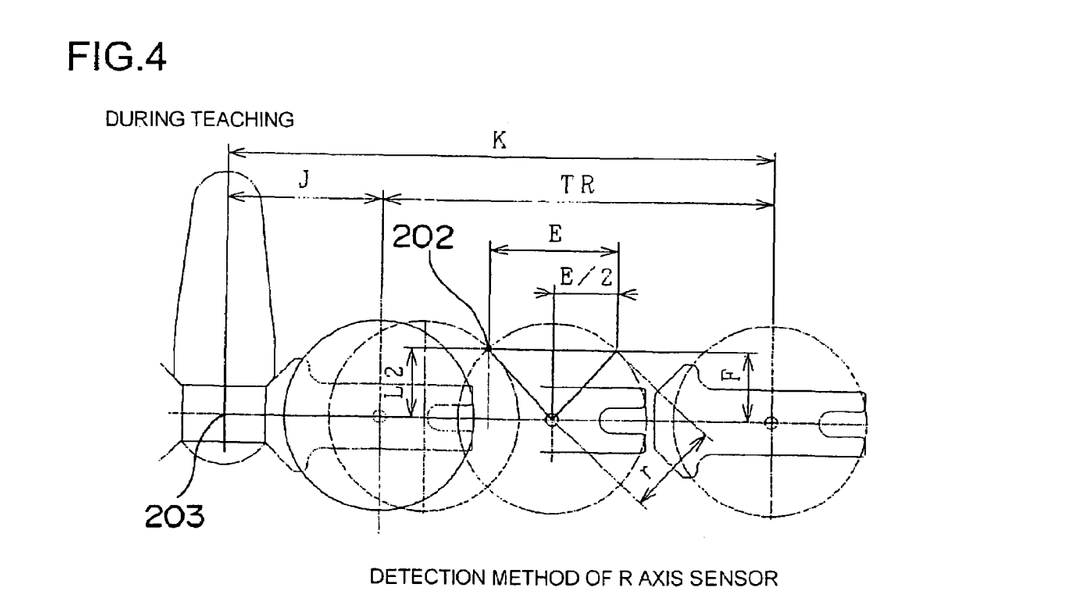
FIG. 4 is a view showing the detection method of the R axis sensor during teaching.

Next, the distance to the sensor mounting position L2 is obtained by detecting the interval in which the R axis sensor 202 is intercepted by the wafer during arm expansion.

FIG. 4 illustrates the method for detecting the R axis sensor 202 during teaching.

By detecting the on/off of the R axis sensor 202, the interception distance E can be computed by $$E = Ron - Roff \text{ (mm)} \quad (6),$$

and based on the obtained distance E and the wafer radius r, the distance F can be computed by $$F = \sqrt{(r^2 - (E/2)^2)} \text{ (mm)} \quad (7).$$

During teaching, the distance F and the R axis sensor mounting position L2 should be the same, so $$L2 = F \text{ (mm)} \quad (8).$$

Moreover, since the quantity of displacement G during teaching is 0, so $$G = L2 - F = 0 \text{ (mm)} \quad (9).$$

Therefore, during teaching, the distance J from the center 203 of the vacuum robot to the center position of the wafer which is a specific position of the wafer during which the wafer is supported at the exterior of the processing chamber on the hand of the vacuum robot 111 capable of rotating in the θ axis direction (hereinafter called processing chamber retract position) is $$J = \sqrt{(D^2 - G^2)} \text{ (mm)} \quad (10).$$

Moreover, the distance K to the center position of a wafer on the hand which is a specific position of the wafer in which the arm of the vacuum robot 111 is expanded so as to place the wafer above the sample stage within the processing chamber with the wafer substantially corresponding to the center of the sample stage (hereinafter called transfer position within the processing chamber) is $$K = J + TR \text{ (mm)} \quad (11).$$

Here, TR is the difference between distance K and distance J during teaching, which is the distance between the processing chamber retract position and the transfer position within the processing chamber.

The correction of position is performed by computing the amount of displacement of D and G acquired during normal operation from D and G obtained during teaching. The movement during normal operation is taken as an example in the following description.

Figure 5:
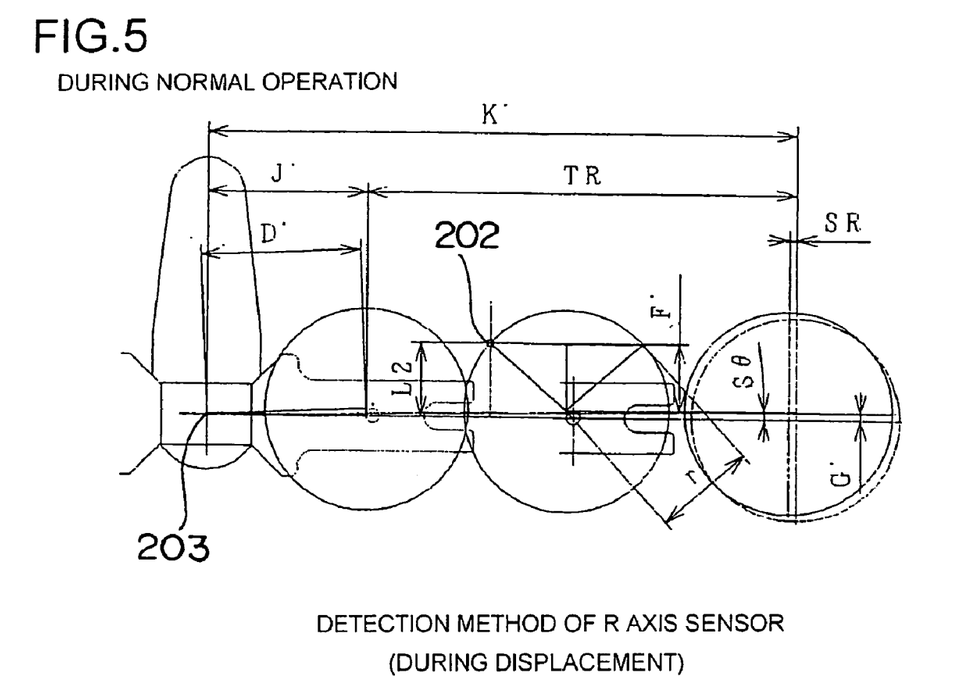
FIG. 5 is a view showing the detection method of the R axis sensor during normal operation.

The wafer being transferred into the load lock chamber 106 or 107 is handed over to the hand of the vacuum robot 111 by the wafer pusher, and when the hand over is completed, the wafer is conveyed into the buffer chamber 110 by the contraction of the arm of the vacuum robot 111. At this time, the wafer intercepts the sensor 202 while the arm of the vacuum robot 111 is contracted. By detecting the interception interval, it becomes possible to compare the wafer position.

FIG. 5 illustrates the method of detection of the R axis sensor 202 during teaching.

Assuming that E' represents the distance being intercepted, $$E' = R' \text{ contraction on} - R' \text{ contraction off (mm)} \quad (12).$$

Next, the vacuum robot 111 starts the rotational movement to transfer the wafer to a predetermined processing chamber, and similarly during this movement, the wafer intercepts the R axis sensor 202. Here, the interception angle θ1 is detected, and based thereon, the distance D from the center 203 of the vacuum robot to the wafer center can be computed.

The method of detection of the θ axis sensor 201 during normal operation is similar to the method for detecting the θ axis sensor illustrated in FIG. 3.

By detecting the θ sensor 201, an interception angle θ1' can be computed by $$\theta 1' = \theta 1'\text{on} - \theta 1'\text{off (deg)} \quad (13),$$

and based on the computed θ1', the distance A' can be computed by $$A' = \cos(\theta 1'/2) \times L1 \text{ (mm)} \quad (14).$$

Further, based on the sensor distance L1 and the computed distance A', the distance B' is computed by $$B' = \sqrt{(L1^2 - A'^2)} \text{ (mm)} \quad (15).$$

Moreover, based on the wafer radius r and the distance B', the distance C' is computed by $$C' = \sqrt{(r^2 - B'^2)} \text{ (mm)} \quad (16).$$

Based on the above arrangement, the distance D' from the center 203 of the vacuum robot to the center of the wafer during normal operation can be computed by $$D' = A' - C' \text{ (mm)} \quad (17).$$

The vacuum robot 111 performs θ axis rotation for a predetermined angle toward the direction of the processing chamber or the load lock chamber being set as the target location, and stops. This position is in front of a gate at the buffer chamber side that communicates the target chamber and the buffer chamber 110 and opens/closes via a gate valve, and in this position, the wafer is stopped temporarily and waits while a sensor not shown detects whether the wafer is mounted on the hand of the arm or not. When the mounting of a wafer cannot be confirmed from the sensor output, it is determined that either the wafer has fallen or the position thereof is greatly displaced, and an error notice is output notifying that transfer defect has occurred and the processing operation of the apparatus is stopped. Then, the arm of the vacuum robot 111 is expanded to the position determined through teaching. During the expansion operation, the wafer intercepts the R axis sensor 202, so that by detecting the interception distance E, the amount of displacement from the position set during teaching can be computed.

By detecting the on/off of the R axis sensor 202, the detection distance E' can be computed by $$E' = R' \text{ expansion on} - R' \text{ expansion off (mm)} \quad (18),$$

and based on the computed distance E' and the wafer radius r, the distance F' can be computed by $$F' = \sqrt{(r^2 - (E'/2)^2)} \text{ (mm)} \quad (19).$$

Based on the R axis sensor mounting position L2 and F', the amount of displacement G' from the teaching can be computed by $$G' = L2 - F' \text{ (mm)} \quad (20).$$

The distance J' from the processing chamber retract position to the center 203 of the vacuum robot is $$J' = \sqrt{(D'^2 - G'^2)} \text{ (mm)} \quad (21),$$

and the distance K' from the center of the vacuum robot 111 to the processing chamber is $$K' = J' + TR \text{ (mm)} \quad (11).$$

Based on the above, the amount of correction Sθ in the rotational direction is $$S\theta = \tan^{-1}((G' - G)/K') \text{ (deg)} \quad (23),$$

and the amount of correction SR in the advancing direction is $$SR = K - K' \text{ (mm)} \quad (24).$$

When the computed Sθ or SR is greater than the predetermined value, a positional data change operation of the vacuum robot 111 is performed, and the movement is adjusted to control the wafer position so as to reduce the values of Sθ or SR to approximate 0. In other words, the wafer position is corrected. Accordingly, the displacement of the wafer position detected during transfer in the actual process can be corrected so that the center of the wafer being transferred approximates the specific position on the mounting surface of the sample stage being the target transfer position as much as possible, according to which the wafer can be mounted accurately on the mounting surface of the sample stage. Furthermore, if the difference in distance detected through expressions (12) and (18) exceeds a predetermined permissible value or if the difference between the following expressions (27) and (28) exceeds a predetermined permissible value, it is assumed that the wafer is displaced on the hand after sensor detection, so a notice using a display or a buzzer is output to the user of the apparatus to notify that a "wafer displacement error" has occurred, and the transfer operation or the processing operation of the wafer in the apparatus is stopped. The comparison of detected results as mentioned above is described with reference to FIG. 7 showing the necessary distances and positional information required for the process.

Figure 7:
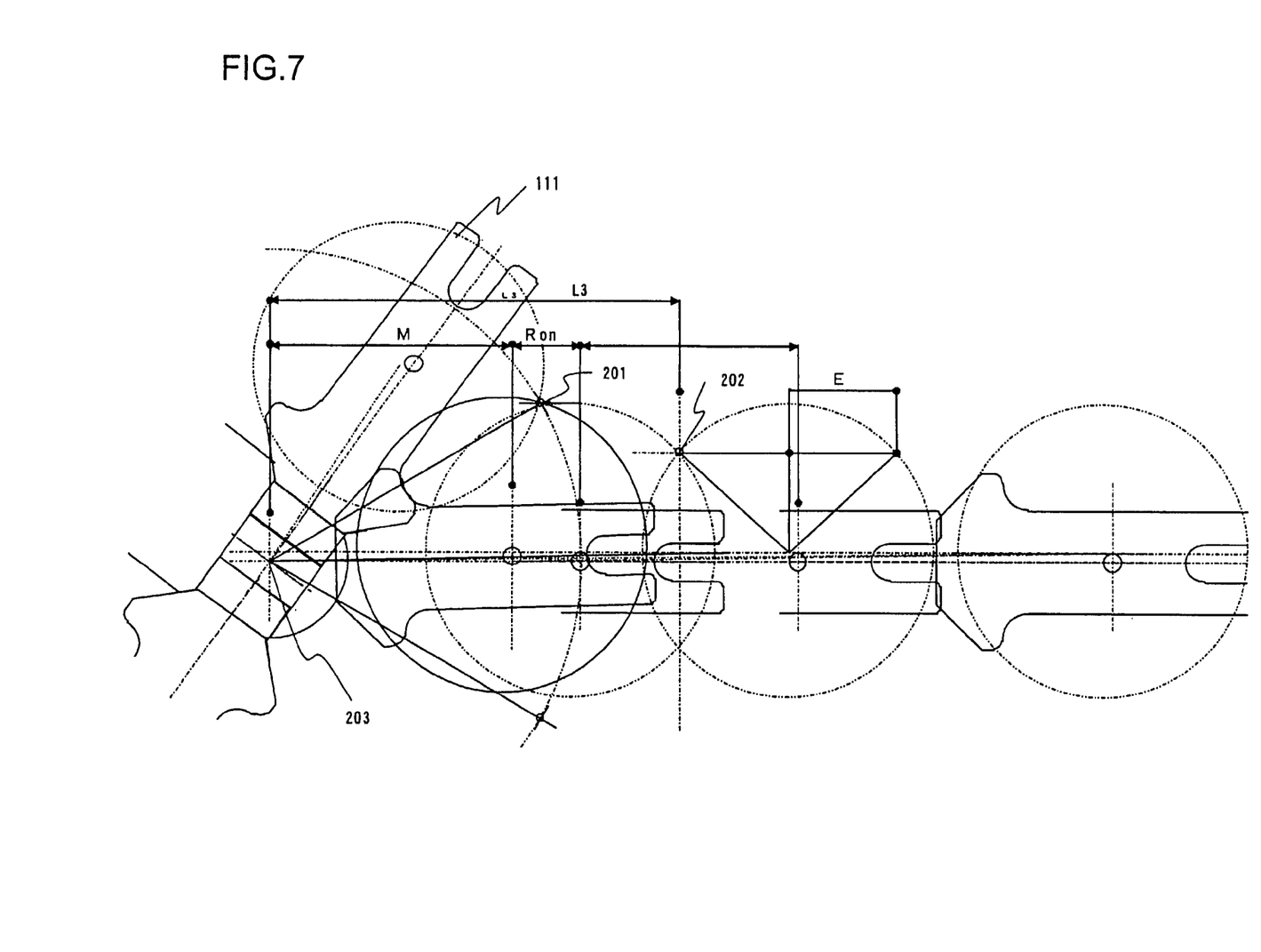
FIG. 7 is a view showing the distance and positional information required for detecting disposition of the wafer.

The distance M from the center 203 of the vacuum robot to the center of the wafer acquired during teaching is $$M = L3 - E/2 - R\text{on (mm)} \quad (25),$$

and the M' during normal operation is $$M' = L3 - E'/2R'\text{on (mm)} \quad (26).$$

The difference P is $$P = M - M' \text{ (mm)} \quad (27).$$

Further, the difference Q between the distance J and J' from the processing chamber retract position to the center 203 of the vacuum robot acquired by equations (10) and (21) is $$Q = J - J' \text{ (mm)} \quad (28).$$

If the difference between P and Q exceeds a predetermined permissible value, it is determined that a "wafer displacement error" has occurred and the operation is stopped.

Figure 6:
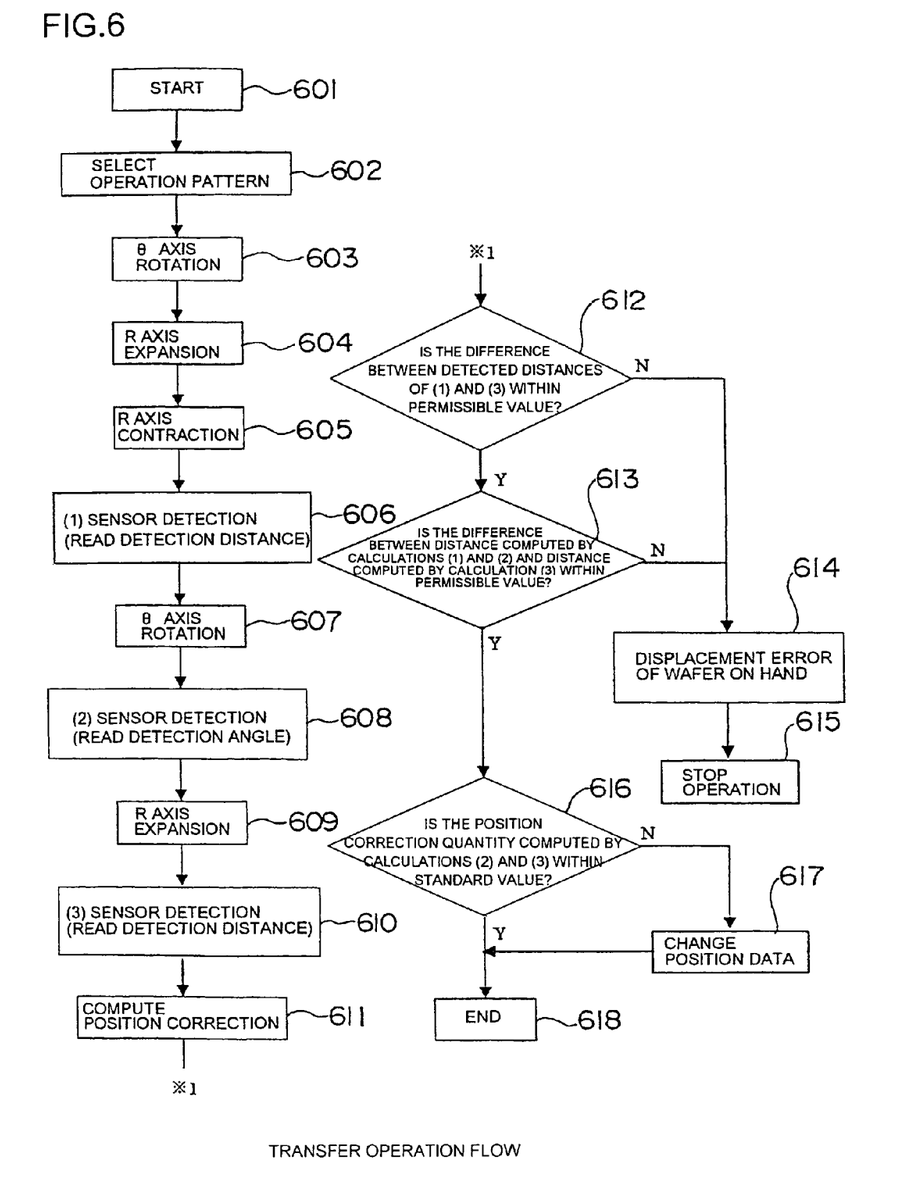
FIG. 6 is a view showing the transfer operation flow of the wafer.

FIG. 6 illustrates an example of a transfer operation flow of a wafer in the semiconductor processing apparatus.

In the wafer transfer operation flow of FIG. 6, at first, the wafer transfer operation flow is started in step 601, and in step 602, the water transfer pattern is selected.

Next, in step 603, the rotational movement of the vacuum robot 111 in the θ axis direction is performed so that the robot faces the load lock chamber or the processing chamber from which the wafer is to be taken out according to the selected transfer pattern.

Thereafter, in step 604, the expansion operation in the R axis direction of the arm of the vacuum robot 111 is performed to take out the wafer. The vacuum robot 111 having the wafer on the sample stage in the processing chamber handed over to the upper surface of the hand at the end of the arm contracts the arm in the R axis direction in step 605.

During contraction operation in the R axis direction of the arm of the vacuum robot 111, in step 606, the R axis sensor 202 detects the interception distance E and reads out the detected distance, which corresponds to expression 12. Next, in step 607, the vacuum robot 111 rotates in the θ axis direction. When the vacuum robot 111 is rotated in the θ axis direction, in step 608, the 8 axis sensor 201 detects and reads the interception angle θ1', which corresponds to equation 13.

After the vacuum robot 111 rotates in the 9 axis direction and faces the direction of the processing chamber or the load lock chamber according to the selected transfer pattern, in step 609, the arm of the vacuum robot 111 is expanded in the R axis direction.

During expansion of the arm of the vacuum robot 111 in the R axis direction, in step 610, the R axis sensor 202 detects the interception distance E' and reads out the detected distance, which corresponds to expression 18.

Next, based on the interception angle θ and interception distances E and E' detected and output from the θ axis sensor 201 and the R axis sensor 204, a position correction calculation is performed in step 611. The sensors outputting information used for the above calculation of position are the sensors located at three locations, or three pairs of sensors, which are the R axis sensor 202 corresponding to the processing chamber from which the wafer is taken out, the R axis sensor 202 corresponding to the processing chamber into which the wafer is transferred, and the θ axis sensor 201 for detecting the passing of the wafer during θ axis rotation of the vacuum robot 111 performed during wafer transfer. The three sensors detect the displacement of position at their respective positions during carrying out and carrying in of the wafer.

Further, the calculation of distances A', B', C' and D' using the interception angle θ1' corresponding to expressions 14, 15, 16 and 17 can be performed at an earlier stage when all the necessary data are acquired, prior to step 611.

Next, in step 612, it is determined whether the difference between the detected distance during R axis contraction in step 606 and the detected distance during R axis expansion in step 610, or E and E', is within a permissible range. If the difference between the detected distances exceeds the permissible range, then it is determined in step 614 that the wafer has been displaced on the hand of the arm of the vacuum robot 111 after sensor detection, and the operation is stopped in step 615. If it is determined in step 612 that the difference between the detected distances is within the permissible range, the procedure advances to step 613.

In step 613, the difference P between the difference Q from the processing chamber retract position to the center of the vacuum robot 203 computed from the interception distance during R axis contraction in step 606 and the detection angle of the θ axis rotation in step 608, which corresponds to expression 28, and the difference P of distance M from the center of the vacuum robot to the wafer center calculated from the detected distance of R axis expansion in step 610 are calculated, which corresponds to expression 27, and whether the difference between P and Q is within a predetermined permissible range or not is determined.

If the difference between P and Q exceeds the permissible range, then it is determined in step 614 that the wafer has been displaced on the hand of the arm after detection of wafer position performed during carrying out of the wafer by the θ axis sensor 201 and R axis sensor 202, especially when the vacuum robot 111 stops temporarily at the standby position and the arm is expanded, and in step 615, the transfer and processing operations of the apparatus are stopped. At this time, a notice is output to the user of the apparatus or the like on a display or via a buzzer that a "wafer displacement error" has occurred during transfer. Further, if it is determined in step 613 that the difference between P and Q is within a predetermined permissible range, the procedure advances to step 616.

In step 616, it is determined whether the position correction quantity computed from the detected angle during θ axis rotation in step 608 and the detected distance during R axis expansion in step 610, which corresponds to the correction quantity Sθ in the rotational direction and the correction quantity SR in the advancing direction or equations 23 and 24, is within a predetermined standard value or not.

If the position correction quantity (Sθ and SR) is within a predetermined standard value, that is, if the position correction quantity is small so that there is no need to change the positional data, the procedure advances to step 618 without changing the positional data and the position correction of the vacuum robot 111 is ended.

If the position correction quantity (Sθ and SR) exceeds the predetermined standard value, the procedure advances to step 617 where the positional data is changed and the position of the wafer or the arm of the vacuum robot 111 is adjusted, then the procedure advances to step 618 and the position correction of the vacuum robot is ended.

The semiconductor processing apparatus according to the above-described embodiment 1 has four processing chambers, two load lock chambers and three cassette mounting platforms, but the numbers of the processing chambers, the load lock chambers and cassette mounting platforms are not restricted thereto, and the numbers thereof can be determined arbitrarily when designing the apparatus. Furthermore, plasma etching, layer deposition and/or sputtering processes are illustrated as exemplary processes performed in the processing chambers, but the processes are not restricted thereto.

Even further, in the above embodiment, the position correction quantity determined in step 616 is composed of the rotational direction correction quantity Sθ and the advancing direction correction quantity SR corresponding to expressions 23 and 24, but the position correction quantity computed based on the output of the θ axis sensor and the R axis sensor can utilize position correction quantities other than the rotational direction correction quantity Sθ and the advancing direction correction quantity SR corresponding to expressions 23 and 24.

Furthermore, the distance data and the like for determining whether the position is within a predetermined permissible range in steps 612 and 613 can utilize data other than the difference between detected distances (E, E') and the difference between P and Q to determine the occurrence of a displacement error of the wafer on the hand.

Moreover, according to the operation flow of FIG. 6, whether the various values are within a permissible value or within a standard value or not is determined in the named order of step 612, step 613 and step 616, but the order or the number of steps of the determination process can be changed.

Regarding the predetermined permissible value and the predetermined standard value used in steps 612, 613 and 616, the standard value is a relatively small value used for determining whether the change in positional data is required or not, whereas the permissible value is a relatively large value used for determining whether the operation should be stopped.

Optimal predetermined values are set as the permissible value and the standard value for performing the transfer operation of the wafer promptly and infallibly in the semiconductor processing apparatus. The predetermined permissible values used in steps 612 and 613 do not necessarily have to be the same, and different predetermined values can be set to correspond to other distance data used for determining the displacement error of the wafer on the hand.

What is claimed is:

1. A vacuum processing method of a semiconductor processing apparatus for transferring a wafer via a vacuum robot, disposed in the interior of a transfer chamber to at least one of a plurality of processing chambers which are coupled to the transfer chamber, the vacuum robot transferring the wafer located thereon through a combination of a rotation movement and an arm's expansion or contraction of the vacuum robot consequently performed, mounting the wafer on a sample stage disposed in the interior of the processing chamber and processing the same, the method comprising:

detecting a position correction quantity of the wafer with respect to the vacuum robot while the wafer is located on the vacuum robot based on both of an output from a θ axis sensor which detects an interception of the wafer during the rotation of the vacuum robot, and an R axis sensor which detects an interception of the wafer during the expansion or contraction of the vacuum robot; and changing an operation of transferring the wafer according to a result of said detecting the position correction quantity.

2. A vacuum processing method of a semiconductor processing apparatus for transferring a wafer via a vacuum robot disposed in the interior of a transfer chamber to at least one of a plurality of processing chambers which are coupled to the transfer chamber, the vacuum robot transferring the wafer located thereon through a combination of a rotation movement and an arm's expansion or contraction of the vacuum robot consequently performed, mounting the wafer on a sample stage disposed in the interior of the processing chamber and processing the same, the method comprising:

detecting a distance data of the wafer with respect to the vacuum robot while the wafer is located on the vacuum robot based on both of an output from a θ axis sensor which detects an interception of the wafer during the rotation of the vacuum robot and an R axis sensor which detects an interception of the wafer during the expansion or contraction of the vacuum robot;

determining that a displacement error has occurred and stopping transferring of the wafer when the distance data exceeds a predetermined value.

3. The vacuum processing method according to claim 1, further comprising:

detecting a distance data of the wafer with respect to the vacuum robot while the wafer is located on the vacuum robot based on both of an output from a θ axis sensor which detects an interception of the wafer during the rotation of the vacuum robot and an R axis sensor which detects an interception of the wafer during the expansion or contraction of the vacuum robot;

determining that a displacement error has occurred and stopping the operation when the distance data exceeds a predetermined value.

4. The vacuum processing method according to claim 1, further comprising:

detecting a distance K from the center of the vacuum robot to the center of the wafer on the vacuum robot expanded inside the processing chamber based on the outputs from both the θ axis sensor and R axis sensor, and detecting correction quantity Sθ in the rotational direction and a correction quantity SR in the advancing direction of the wafer position with respect to the vacuum robot; and changing an operation of the transferring the wafer if the correction quantity Sθ in the rotational direction or the correction quantity SR in the advancing direction exceeds a predetermined value.

5. The vacuum processing method of a semiconductor processing apparatus according to claim 2, comprising:

determining that a displacement error has occurred and stopping transferring the wafer when a difference between the interception distances E during expansion or contraction of the vacuum robot computed based on the output from the R axis sensor exceeds a predetermined value.

6. A vacuum processing apparatus comprising:

a buffer chamber inside of which a pressure is reduced and a wafer is transferred;

a plurality of processing chambers coupled to the buffer chamber, inside each of the plural processing chambers the wafer is transferred to and processed therein;

a vacuum robot disposed in the buffer chamber transferring the wafer located thereon to the one of the plural processing chambers through a combination of a rotation movement and an arm's expansion or contraction of the vacuum robot, consequently performed;

a plurality of θ axis sensors which detects an interception of the wafer during the rotation of the vacuum robot;

a plurality of R axis sensor which detects an interception of the wafer during the expansion or contraction of the vacuum robot; and a control unit, which controls movement of the vacuum robot, for transferring the wafer according to a distance of the wafer with respect to the vacuum robot which is detected while the wafer is located on the vacuum robot based on both of an output from a θ axis sensor and an R axis sensor;

wherein;

a distance K from the center of the vacuum robot to the center of the wafer on the vacuum robot expanded inside the processing chamber is detected based on the outputs from both the θ axis sensor and R axis sensor and a correction quantity Sθ in the rotational direction and a correction quantity SR in the advancing direction of the wafer position with respect to the vacuum robot is detected; and an operation of the transferring the wafer is changed if the correction quantity Sθ in the rotational direction or the correction quantity SR in the advancing direction exceeds a predetermined value.

7. A vacuum processing apparatus comprising:

a buffer chamber having a inside of which a pressure is reduced and a wafer is transferred;

a plurality of processing chambers coupled to the buffer chamber, inside each of the plural processing chambers the wafer is transferred to and processed therein;

a vacuum robot, disposed in the buffer chamber transferring the wafer located thereon to the one of the plural processing chambers through a combination of a rotation movement, and an arm's expansion or contraction of the vacuum robot consequently performed;

a plurality of θ axis sensors which detects an interception of the wafer during the rotation of the vacuum robot;

a plurality of R axis sensors which detects an interception of the wafer during the expansion or contraction of the vacuum robot; and a control unit which controls the movement, of the vacuum robot, transferring the wafer according to a distance of the wafer with respect to the vacuum robot, which is detected while the wafer is located on the vacuum robot based on both of an output from a θ axis sensor and an R axis sensor, the control unit changing an operation of the transferring the wafer by the vacuum robot when the distance data exceeds a predetermined value.

8. The vacuum processing apparatus according to claim 6, wherein:

the control unit determines that a displacement error has occurred and stops transferring the wafer when a difference between the interception distances E during expansion or contraction of the vacuum robot detected based on the output from the R axis sensor exceeds a predetermined value.

9. The vacuum transfer apparatus according to claim 6, wherein:

when the difference between the amount of change of distance M from the center of the vacuum robot to the center of the wafer obtained based on the output from the R axis sensor and the amount of change of distance J from a process chamber retract position to the center of the wafer obtained based on the outputs from the R axis sensor and the θ axis sensor exceeds a predetermined permissible value, it is determined that a displacement error has occurred and the operation is stopped.

10. A vacuum processing apparatus comprising:

a buffer chamber having a vacuum robot disposed therein;

a plurality of processing chambers coupled to the buffer chamber, inside each of the plural processing chambers the wafer is transferred to and processed therein;

a plurality of load lock chambers coupled to the buffer chamber;

an atmospheric transfer chamber coupled to the load lock chambers and having an atmospheric robot;

a plurality of cassette mounting platforms connected to the atmospheric transfer chamber;

a vacuum robot disposed in the buffer chamber transferring the wafer located thereon to the one of the plural processing chambers through a combination of a rotation movement and an arm's expansion or contraction of the vacuum robot consequently performed;

wherein the vacuum robot receives a wafer disposed in the load lock chamber or the processing chamber and transfers the wafer to another load lock chamber or processing chamber via rotational movement and expansion/contraction movement;

the apparatus further comprising a plurality of θ axis sensor which detects an interception of the wafer during the rotation of the vacuum robot and a plurality of R axis sensor which detects an interception of the wafer during the expansion or contraction of the vacuum robot;

a control unit which controls the movement of the vacuum robot transferring the wafer according to a distance of the wafer with respect to the vacuum robot based on both of an output from θ axis sensor and an R sensor, the control unit changing an operation of the transferring the wafer by the vacuum robot or determining that a displacement error has occurred to stop transferring the wafer when the distance data exceeds a predetermined value.

* * * * *